PORTABLE TELEVISION RECEIVER

Filed Nov. 16, 1966

INVENTORS.
James E. Vistain Jr.
William L. Arrington
BY Nicholas A. Camasto
ATTY.

3,489,852

PORTABLE TELEVISION RECEIVER

James E. Vistain, Jr., Glenview, and William L. Arrington, Hoffman Estates, Ill., assignors to Admiral Corporation, Chicago, Ill., a corporation of Delaware Filed Nov. 16, 1966, Ser. No. 594,766
Int. Cl. H01j *29/02*
U.S. Cl. 178—7.9 4 Claims

ABSTRACT OF THE DISCLOSURE

A television receiver having mating front and rear cabinet portions adapted to support a tuner assembly and chassis assembly solely by sandwiching them between cooperating support means on the front and rear cabinet portions. The only fasteners used are those securing the front and rear portions to each other.

This invention relates in general to portable television receivers, and in particular to portable television receivers employing a modular construction which may be assembled without the necessity of inserting fasteners into or through the individual modules. More particularly, this invention relates to portable television receivers having a printed circuit board supported by a non-conductive base, wherein the printed circuit board and a separate television tuner are mounted in a two piece receiver cabinet by being sandwiched between the cabinet front and back walls.

Due to the economy and reduction in total weight, it is desirable in many portable television receivers to employ a chassis of the transformerless type. Typically, such chassis are fabricated of metal or are supported by a metal frame which is maintained at line potential, as are other conductive elements electrically connected thereto. Mounting the chassis and other electrical elements in an enclosure suitable for a portable television receiver, such as an enclosure fabricated of plastic, has continually presented a number of annoying problems, the solutions to which have often required substantial expense.

To insure safe operation of a transformerless portable television receiver, it is essential that there be no conductive material such as metal fasteners or metal knobs exposed to the user, which are at line potential. Consequently, when threaded metal fasteners were used to secure the "hot" chassis assembly to the cabinet, non-conductive plugs or inserts were required in the chassis into which the screws were threaded. Thus, while the heads of the metal screws were exposed to the user from outside the receiver cabinet, the screws themselves were not at line potential due to the insulative properties of the non-conductive plugs.

Another method of securing a chassis in a receiver cabinet is to support the printed circuit board directly from the cabinet, either with or without fastening screws. This method is typically quite expensive, and would be more satisfactory in a receiver employing transistorized signal translation means than in a vacuum tube type receiver which generally includes components of substantial weight.

Another problem with portable television receivers, especially those employing vacuum tubes, has been that the components were mounted about the cabinet interior in a generally cluttered arrangement. Often the components were mounted in more than one location, and even on more than one printed circuit board. For example, while a main chassis was utilized, the controls accessible to the user were typically placed in a location separate from the main chassis, sometimes in a remote section of the cabinet.

This invention obviates many of the problems and disadvantages of prior art portable television receivers by utilizing a chassis construction wherein substantially all the components comprising the receiving circuitry, including the controls, are mounted on a single chassis assembly. The chassis assembly comprises a printed circuit board which is strengthened by a nonconductive base having a generally open framework. The base insures a relatively rigid chassis assembly which precludes excessive strain being imposed on the printed circuit board which might rupture the conductive copper foil. This excessive strain might be caused by the user subjecting the receiver to abnormal shock. In addition, the chassis assembly and a separate tuner are maintained within the receiver cabinet by integrally molded cabinet supports. These supports sandwich the receiver components between the cabinet front and rear portions as they are fastened together with screws inserted into the cabinet material, and not into any of the components or their supports.

Accordingly, it is the primary object of this invention to provide a portable television receiver which may be assembled without inserting fasteners into the component assemblies.

Another object of this invention is to provide a portable television receiver having a modular construction wherein all of the signal receiving components including the controls therefor, except the tuner, are mounted on a single chassis assembly which includes a printed circuit board.

An additional object of this invention is to provide a chassis assembly comprising a printed circuit board strengthened by a non-conductive base for mounting electrical components of substantial weight thereon.

Another object of this invention is to provide a non-conductive base for supporting a printed circuit board, thereby facilitating handling and protecting said board during manufacture when said board has components of substantial weight mounted thereon.

Other objects of this invention will become apparent upon an examination of the following description taken in conjunction with the accompanying drawings wherein.

Figures 1, 2, 3, 4, 5:
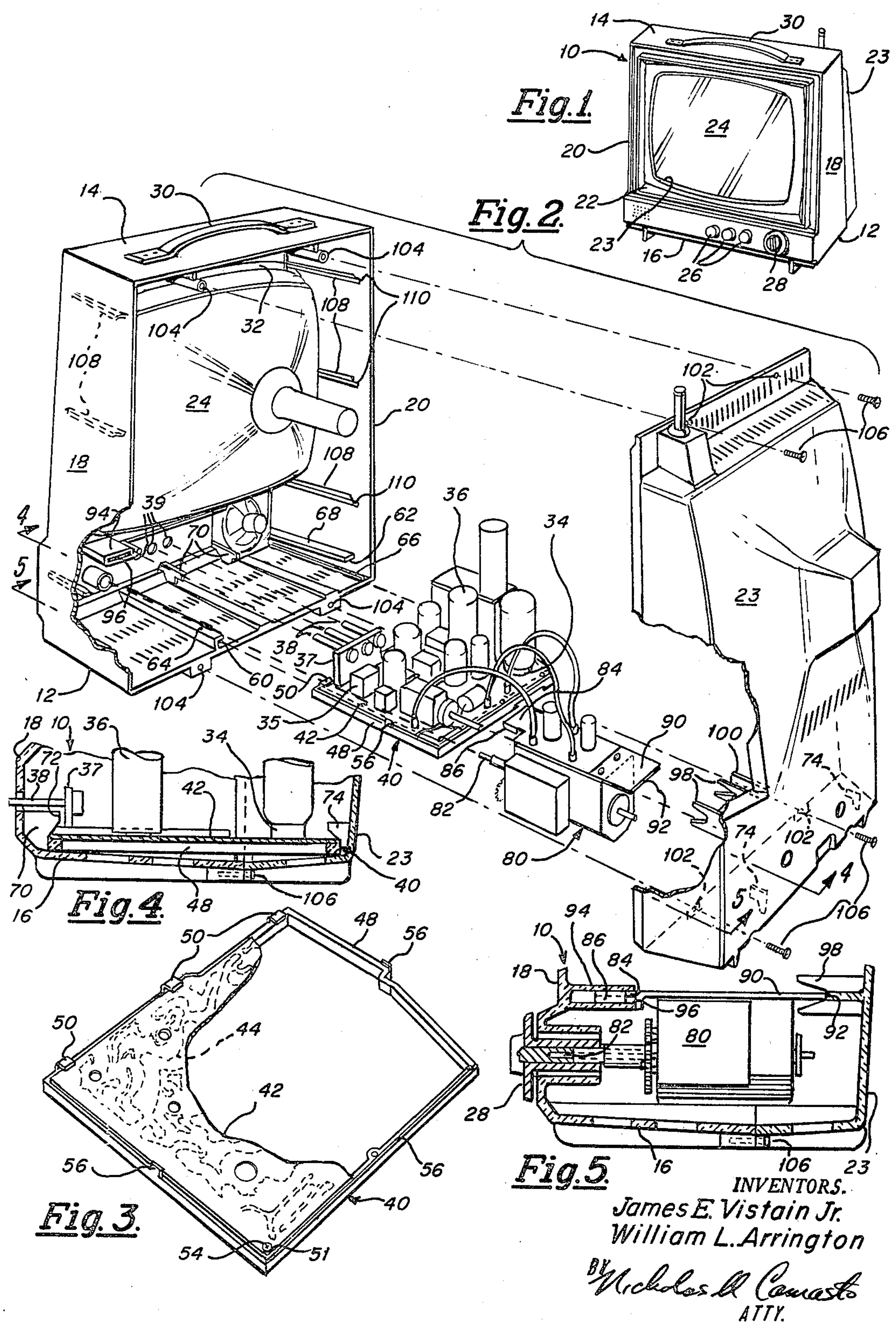
FIG. 1 is a three dimensional front view of a portable television receiver in which the invention is incorporated.
FIG. 2 is an enlarged, exploded view of a portable television receiver showing the constructional details of the cabinet and placement of the assemblies therewithin.
FIG. 3 is a three dimensional view of a non-conductive base for a printed circuit board, with a portion of the board shown secured thereto.
FIG. 4 is an elevation view taken along line 4—4 of FIG. 2 illustrating the supports for maintaining the printed circuit board and its base in the cabinet.
FIG. 5 is an elevation view taken along line 5—5 of FIG. 2 showing the tuner secured within the cabinet by being sandwiched between the cabinet front and rear portions.

Referring now to FIG. 1 of the drawings there is shown a television receiver having a cabinet, generally referred to by reference numeral 10, molded of plastic insulated material. Cabinet 10 comprises a main front portion 12 which includes a top 14, a bottom 16, side walls 18 and 20, and a front wall 22. A back wall 23 forms a cover for the rear of the receiver and is secured thereto by threaded fasteners in a manner to be explained in further detail below. Front wall 22 has a central opening 23 through which a picture tube 24 is viewed. A plurality of control knobs 26 are operable from the front wall, as is a knob 28 secured to a tuner for selecting the desired television channel. A handle 30 is secured to top 14 for the convenience of the user in moving the portable television receiver.

In FIG. 2, it can be seen that picture tube 24 includes a rectangular metal support ring 32 about the periphery thereof, adjacent the viewing screen. The picture tube is supported solely from the cabinet front wall by any conventional means such as with threaded fasteners, although they are not shown in the drawings.

Looking now at FIG. 3 in addition to FIG. 2, the chassis, generally referred to by reference numeral 40, comprises an irregularly shaped printed circuit board 42 supported by an open, non-conductive base 48 fabricated of linear polyethylene or other insulating material. The printed circuit board is constructed of phenolic plastic and has current carrying conductive foil paths 44 laminated to the underside thereof. It is secured to the base by tabs 50 struck from the upper face of one side of the base, and having ends folded 90° to overlay the flat surface of the board. The folded ends maintain the board in contact with its supporting base.

At the opposing side of the base, openings 51 are provided in the printed circuit board for fasteners 54 which are threaded into apertures in the base, thereby securely holding the board. A raised edge 56 at portions of the remaining sides of the base assists in aligning the board on the base during assembly, and in maintaining it in place while being secured in the receiver cabinet.

The printed circuit board supports electronic components such as tube sockets 34, a matching transformer 35, electrolytic capacitors 36, adjustment controls 37, and other signal translation elements. These components are mounted on the printed circuit board with their connectors extending through apertures therein, to the conductive foil. The connectors are soldered to the foil on the underside of the board, thereby forming a complete circuit.

The total weight of these components imposes a substantial strain upon the phenolic board, which if subjected to abnormal shock, might cause fracture of the board and rupture the conductive foil laminated to its underside The base supports the printed circuit board to reduce the chances of fracture. The base is more rigid than the board, but it is flexible enough to yield therewith. Since the base is not rigidly secured to the printed circuit board, there is some relative movement therebetween. This movement insures substantially uniform contact between the base and the board for more evenly distributing the effects of a shock, and is especially effective in preventing damage.

The adjustment controls 37 are secured adjacent an edge of the printed circuit board, with several adjustment shafts 38 extending beyond the edge. These controls and their shafts are permanently secured to the board during its manufacture. Apertures 39 are provided in the cabinet front below opening 23 for receipt of the shafts upon assembly of the chassis into the cabinet front portion.

The advantages of the non-conductive base are readily apparent with respect to a safer portable television receiver, although other advantages may not be as obvious. One of these non-obvious advantages is that in designing the printed circuit board, the entire board area can be utilized for either electronic components or conductive foil. With a non-conductive base, conductive foil may be laminated to the underside of the board, without a separate insulating gasket, even in those areas which are in contact with the base. Obviating this limitation, which was prevalent in typical prior art chassis assemblies, allows utilization of a larger board area.

Referring now to FIG. 4 in addition to FIG. 2, two parallel channel guides 60 and 62 are provided adjacent the cabinet bottom for receipt and retention of the printed circuit board and its non-conductive base. Each channel guide is molded integrally with the cabinet front portion, and each extends from the front to the rear of the receiver. Channel guide 60 includes a horizontal portion 64 which overlies the board and its base to prevent upward movement thereof. The remaining channel guide is formed of the upper face of a bottom rail 66 and a horizontal side shelf 68 depending from the interior of side wall 20. Stops 70 are provided at the intersection of the cabinet front and bottom to limit the distance the printed circuit board and its base can be inserted into the channel guides. These stops have overhanging tabs 72 which assist in keeping the printed circuit board and its base firmly against the cabinet bottom.

The cabinet back wall also includes chassis stops which take the shape of inwardly projecting fingers 74 at the intersection of the back wall and cabinet bottom. These stops provide a slight interference fit with the rear of the chassis assembly as the cabinet back portion is secured to the front portion. Fingers 74 have an inclined bottom edge which contacts the upper surface of the chassis assembly to maintain it in place.

A conventional tuner 80 is provided for selectively tuning the desired television frequency. The tuner is electrically connected to the printed circuit board and is adjusted through a control shaft 82 and channel selector knob 28. The tuner includes a front bracket 84 and a rear bracket 90, both secured to its top. The front bracket has a forwardly extending tongue 86 with downwardly curved side members for additional thickness. The rear bracket is provided with a flat, relatively narrow plate 92.

The tuner is supported in the interior of the cabinet by its front and rear brackets. The front bracket cooperates with a rearwardly extending boss 94 (FIG. 2) integrally molded with the front wall, and having a rectangular opening 96 therein for receipt of tongue 86. During assembly, tongue 86 is inserted into opening 96 and the tuner is held in cantilever suspension without the necessity of screws, until the rear cover is attached.

The rear cover includes a clustered support at the level of the rear tuner bracket. This support comprises a pair of forwardly extending V shaped fingers 98 which contact the rear bracket plate 92 to align the tuner by lifting it and the bracket, as the cover is secured to the cabinet front portion. Side members 100 of the support insure stabilization of the tuner in the transverse direction.

The rear cover of the receiver cabinet which comprises not only the rear wall, but also a section of the side, top, and bottom walls, includes apertures 102 at the corners which are in line with bosses 104 integrally molded to the cabinet front portion. Threaded fasteners 106 are inserted through apertures 102 and screwed into bosses 104 as the last stage of the receiver assembly. For added strength, ribs 108 are provided from front to back along the interior of the side walls. These ribs include notched ends 110 which receive the side wall sections of the cabinet back.

From the above description it can be seen that the tuner and chassis assemblies are maintained within the plastic cabinet without the necessity of fasteners being inserted therein. The tuner is maintained by being sandwiched between the cabinet front and rear portions, although a substantial part of its support is derived from the front boss which receives the tongue of the tuner bracket. The chassis assembly is maintained in the cabinet by the channel guides in addition to the front and rear tabs which are effective upon the two-piece plastic cabinet being assembled and secured together. The chassis assembly comprises a printed circuit board supported by a non-conductive base which provides more convenient handling thereof during manufacture. The assembly includes all of the receiving components except the tuner. Controls for operating the receiver are conveniently located on the chassis assembly adjacent its front edge for extension through a series of control apertures provided through the front wall.

It is obvious that upon study by those skilled in the art, the dsclosed invention may be altered or modified both in physical appearance and construction without departing from it inventive concept. Therefore, the scope of protection to be given this invention should not be limited by the embodiment described above, but should be determined by the essential descriptions thereof which appear in the appended claims.

The embodiments of the invention in which an exclusive property or privilege is claimed are defined as follows:

1. A television receiver comprising in combination: a cabinet having a front portion and a rear portion adapted to be secured together to define an enclosed volume; said cabinet front portion defining an opening therein; a television picture tube secured to said cabinet front portion and having a viewing screen positioned at said opening; a tuner; said tuner having bracket means and a control element for selecting television signals; chassis means having signal translation means mounted thereon; and support means integral with said cabinet for supporting said tuner and chassis means solely by sandwiching them between said cabinet front and rear portions when secured together, thereby eliminating the necessity of separate fasteners.

2. The combination as set forth in claim 1 wherein said signal translation means include components of substantial weight which may impose excessive strain on said chassis means; said chassis means comprising a printed circuit board supported by a non-conductive base for increased rigidity and strength; channel guide members in spaced apart relation adjacent a bottom of said cabinet for receiving said printed circuit board and base; and wherein said support means include inwardly projecting fingers partially overlying said printed circuit board for positioning said board and base upon assembly of said receiver.

3. The combination as set forth in claim 2 wherein said tuner bracket means comprise a tongue extending from said tuner towards said front wall, and a plate extending toward said rear wall; said support means further including a rearwardly extending boss integral with said front portion; said boss defining an aperture for receipt of said tongue, thereby providing cantilever support of said tuner during assembly, and V shaped fingers integral with said rear portion and extending inwardly of said housing; said V shaped fingers cooperating with said rear plate to position said tuner in said cabinet upon assembly of said receiver.

4. The combination as set forth in claim 3 including additionally: a plurality of apertures defined by a front wall of said cabinet above said printed circuit board; and wherein all the components comprising said signal translation means are mounted on said printed circuit board, including adjustable controls having adjustment shafts extending beyond a front edge of said board and through said apertures to provide control thereof exterior of said housing; said tuner being supported in said cabinet separate from said chassis means, but electrically connected thereto.

References Cited

UNITED STATES PATENTS 3,255,311 6/1966 Hofmeister et al. ---- 178—7.9

FOREIGN PATENTS 1,195,829 1/1965 Germany.

JOHN W. CALDWELL, Primary Examiner

B. L. LEIBOWITZ, Assistant Examiner